US010638611B2

(12) United States Patent
Nishikawa et al.

(10) Patent No.: US 10,638,611 B2
(45) Date of Patent: Apr. 28, 2020

(54) COIL COMPONENT AND CIRCUIT BOARD IN WHICH COIL COMPONENT ARE EMBEDDED

(71) Applicant: TDK Corporation, Tokyo (JP)

(72) Inventors: Tomonaga Nishikawa, Tokyo (JP); Kouji Kawamura, Tokyo (JP); Tomokazu Ito, Tokyo (JP); Tadashi Watanabe, Tokyo (JP); Mitsuhiko Endo, Tokyo (JP); Fumio Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 767 days.

(21) Appl. No.: 15/293,504

(22) Filed: Oct. 14, 2016

(65) Prior Publication Data

US 2017/0111995 A1 Apr. 20, 2017

(30) Foreign Application Priority Data

Oct. 19, 2015 (JP) .................. 2015-205162

(51) Int. Cl.
| | |
|---|---|
| H01F 17/00 | (2006.01) |
| H01F 27/29 | (2006.01) |
| H05K 1/18 | (2006.01) |
| H01F 17/04 | (2006.01) |
| H01F 27/255 | (2006.01) |
| H01F 27/28 | (2006.01) |
| H05K 1/11 | (2006.01) |

(52) U.S. Cl.
CPC ......... *H05K 1/185* (2013.01); *H01F 17/0013* (2013.01); *H01F 17/04* (2013.01); *H01F 27/255* (2013.01); *H01F 27/2804* (2013.01); *H01F 27/292* (2013.01); *H05K 1/115* (2013.01); *H01F 2027/2809* (2013.01); *H01F 2027/2819* (2013.01); *H05K 2201/1003* (2013.01)

(58) Field of Classification Search
CPC ..... H01F 17/0013; H01F 27/292; H01F 27/29
See application file for complete search history.

(56) References Cited

U.S. PATENT DOCUMENTS

| | | | | |
|---|---|---|---|---|
| 2004/0061587 A1* | 4/2004 | Hong | .................. | H01F 17/0013 336/200 |
| 2005/0253677 A1* | 11/2005 | Ito | ....................... | H01F 17/0013 336/200 |

(Continued)

FOREIGN PATENT DOCUMENTS

| | | | |
|---|---|---|---|
| JP | 2013-626787 A | | 6/2013 |
| JP | 2015-130472 A | | 7/2015 |
| JP | 2015130472 A | * | 7/2015 |

*Primary Examiner* — Elvin G Enad
*Assistant Examiner* — Malcolm Barnes
(74) *Attorney, Agent, or Firm* — Young Law Firm, P.C.

(57) ABSTRACT

Disclosed herein is a coil component that includes a first planar spiral conductor; a second planar spiral conductor laminated on the first planar spiral conductor and wound in an opposite direction to the first planar spiral conductor; a first external terminal electrically connected to an outer peripheral end of the first planar spiral conductor; a second external terminal electrically connected to an outer peripheral end of the second planar spiral conductor; and a third external terminal electrically connected in common to inner peripheral ends of the first and second planar spiral conductors.

14 Claims, 5 Drawing Sheets

(56) References Cited

U.S. PATENT DOCUMENTS

| | | | |
|---|---|---|---|
| 2006/0022770 A1* | 2/2006 | Asakawa | H01F 17/0013 333/175 |
| 2006/0114634 A1* | 6/2006 | Terada | H01Q 1/50 361/118 |
| 2009/0284340 A1* | 11/2009 | Nishikawa | H01F 17/0013 336/200 |
| 2011/0007439 A1* | 1/2011 | Asakawa | H01F 17/0006 361/56 |
| 2011/0279100 A1* | 11/2011 | Ikriannikov | H02M 7/003 323/271 |
| 2012/0112869 A1* | 5/2012 | Nishikawa | H01F 17/0013 336/200 |
| 2012/0212919 A1 | 8/2012 | Mano et al. | |
| 2013/0062994 A1* | 3/2013 | Ogawa | H01F 17/0013 310/311 |
| 2013/0200977 A1* | 8/2013 | Miyazaki | H01L 24/24 336/192 |
| 2013/0222101 A1* | 8/2013 | Ito | H01F 17/04 336/83 |
| 2013/0293338 A1* | 11/2013 | Park | H01F 27/343 336/200 |
| 2014/0009254 A1* | 1/2014 | Ohkubo | H01F 27/2804 336/192 |

\* cited by examiner

COIL COMPONENT AND CIRCUIT BOARD IN WHICH COIL COMPONENT ARE EMBEDDED

BACKGROUND OF THE INVENTION

Field of the Invention

The present invention relates to a coil component and, more particularly, to a coil component that can be used as a coupling inductor. The present invention further relates to a circuit board in which such a coil component is embedded.

Description of Related Art

A coil component called "coupling inductor" may be used as a smoothing coil for a switching power supply such as a DC/DC converter. As described in Japanese Patent Application Laid-open Nos. 2013-526787 and 2015-130472, the coupling inductor has a configuration in which windings wound in opposite directions are magnetically coupled to each other. When a current is made to flow in one winding, an electromotive force is generated to make the current flow also in the other winding. Thus, when the coupling inductor is used as a switching power supply smoothing coil, an inrush current peak can be reduced.

A coil component described in Japanese Patent Application Laid-open No. 2013-526787 has a configuration in which a winding is made up of wire or foil. In FIG. 32 of Japanese Patent Application Laid-open No. 2013-526787, a configuration in which the end portions of two windings are connected to a common external terminal is illustrated. Further, Japanese Patent Application Laid-open No. 2015-130472 discloses a coil component obtained by forming a planar spiral conductor on both the front and back surfaces of an insulating substrate.

However, in the coil component described in Japanese Patent Application Laid-open No. 2013-526787, the winding is formed by a wire or a foil, which may complicate a manufacturing process and cause a large variation in characteristics obtained.

On the other hand, in the coil component described in Japanese Patent Application Laid-open No. 2015-130472, a spiral conductor is used as a winding, so that a variation in characteristics is small. However, in the invention of Japanese Patent Application Laid-open No. 2015-130472, two planar spiral conductors are wound concentrically, which may make adjustment of the magnetic coupling coefficient difficult. That is, in the coupling inductor, a leakage flux component free from magnetic coupling brings the smoothing action, so that in order to obtain desired characteristics, it is necessary to reduce the magnetic coupling coefficient to some extent and thus to ensure a sufficient leakage flux component. However, in order to reduce the magnetic coupling coefficient in the coil component described in Japanese Patent Application Laid-open No. JP 2015-130472, it is necessary to increase the interval between the two concentrically-wound planar spiral conductors. This may result in increase in the planar size of a product.

SUMMARY

An object of the present invention is therefore to provide a coil component allowing adjustment of the magnetic coupling coefficient without involving increase in the planar size of a product and having a small variation in characteristics and a circuit board incorporating the coil component.

A coil component according to the present invention includes: a first planar spiral conductor; a second planar spiral conductor laminated on the first planar spiral conductor and wound in the opposite direction to the first planar spiral conductor; a first external terminal connected to the outer peripheral end of the first planar spiral conductor; a second external terminal connected to the outer peripheral end of the second planar spiral conductor; and a third external terminal connected commonly to the inner peripheral ends of the first and second planar spiral conductors.

A circuit board according to the present invention has a feature in that the above-described coil component is embedded therein.

According to the present invention, the planar spiral conductor is used as a winding, making a variation in characteristics small. In addition, the two planar spiral conductors are magnetically coupled to each other in a lamination direction thereof, allowing the magnetic coupling coefficient to be adjusted without influencing the planar size of a product. Further, the inner peripheral ends of the two planar spiral conductors are short-circuited, eliminating the need for short-circuiting the two planar spiral conductors on the circuit board. Furthermore, the number of terminals is small, so that eddy-current loss generated at the terminal part is small.

In the present invention, preferably the inner peripheral ends of the first and second planar spiral conductors overlap each other in the lamination direction and are short-circuited in the lamination direction at the overlapping position. This eliminates the need for providing a connection conductor for connecting the inner peripheral ends, thereby simplifying the structure.

In this case, at least a part of the third external terminal preferably overlaps the inner peripheral ends of the first and second planar spiral conductors in the lamination direction. This eliminates the need for providing a connection conductor for connecting the inner peripheral ends of the planar spiral conductors, thereby simplifying the structure. In addition, the third external terminal is disposed immediately above the inner peripheral ends, so that a high heat radiation effect can obtained.

The coil component according to the present invention preferably further includes a non-magnetic insulating layer disposed between the first and second planar spiral conductors. This can provide a high degree of magnetic coupling between the spiral conductors.

In this case, the coil component preferably further includes first and second magnetic members that sandwich the first planar spiral conductor, non-magnetic insulating layer, and the second planar spiral conductor in the lamination direction. In this configuration, the second magnetic member preferably has an opening part through which the inner peripheral end of the second planar spiral conductor is exposed, and the third external terminal is preferably embedded in the opening part. With the above configuration, heat can be radiated efficiently through the opening part formed in the second magnetic member.

Further, in this case, the coil component preferably further includes a connection conductor provided on the same plane as the second planar spiral conductor and connected to the outer peripheral end of the first planar spiral conductor. In this configuration, the second magnetic member preferably further includes a first cut part through which the connection conductor is exposed and a second cut part through which the outer peripheral end of the second planar spiral conductor is exposed, and the first and second external terminals are preferably embedded in the first and second cut parts, respectively. With the above configuration, the first to third external terminals can be exposed to the upper surface of the second magnetic member.

The first and second magnetic members may be made of different magnetic materials. In this case, the second magnetic member may be made of a resin containing a magnetic body.

In the present invention, the coil component preferably further includes a third magnetic member provided in the vicinity of the inner peripheral ends of the first and second planar spiral conductors when viewed in the lamination direction so as to penetrate the inner diameter portions of the first and second planar spiral conductors. In this configuration, the first and second external terminals are preferably positioned at one side of the third magnetic member in the lamination direction, and the third external terminal is preferably at the other side of the third magnetic member in the lamination direction. With the above configuration, the distance between the first and second external terminals and the third external terminal is increased, whereby a short-circuit therebetween can be prevented.

In the present invention, the first to third external terminals to be exposed are preferably made of the same material as that of a metal material of the first and second planar spiral conductors. This eliminates the need to apply plating to the first to third external terminals, thereby allowing reduction in manufacturing cost. In this case, the metal material is preferably copper (Cu).

According to the present invention, there can be provided a coil component allowing adjustment of the magnetic coupling coefficient without involving increase in the planar size of a product and having a small variation in characteristics and a circuit board incorporating the coil component.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
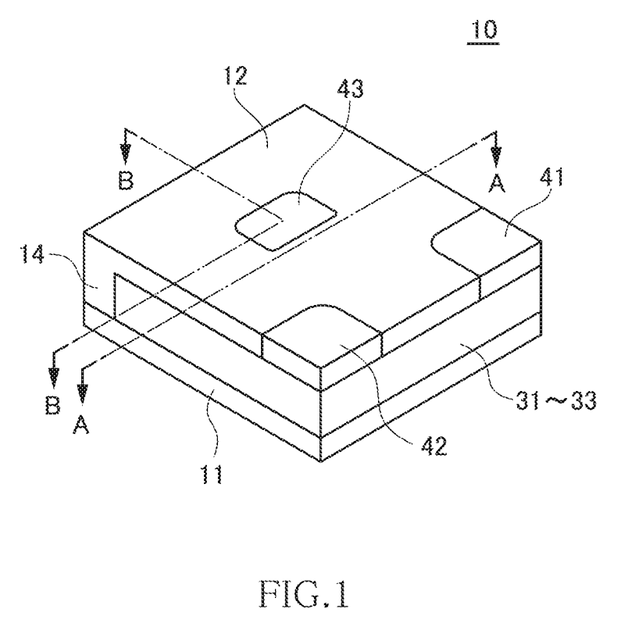
FIG. 1 is a perspective view illustrating the outer appearance of a coil component according to a preferred embodiment of the present invention.
Figure 2:
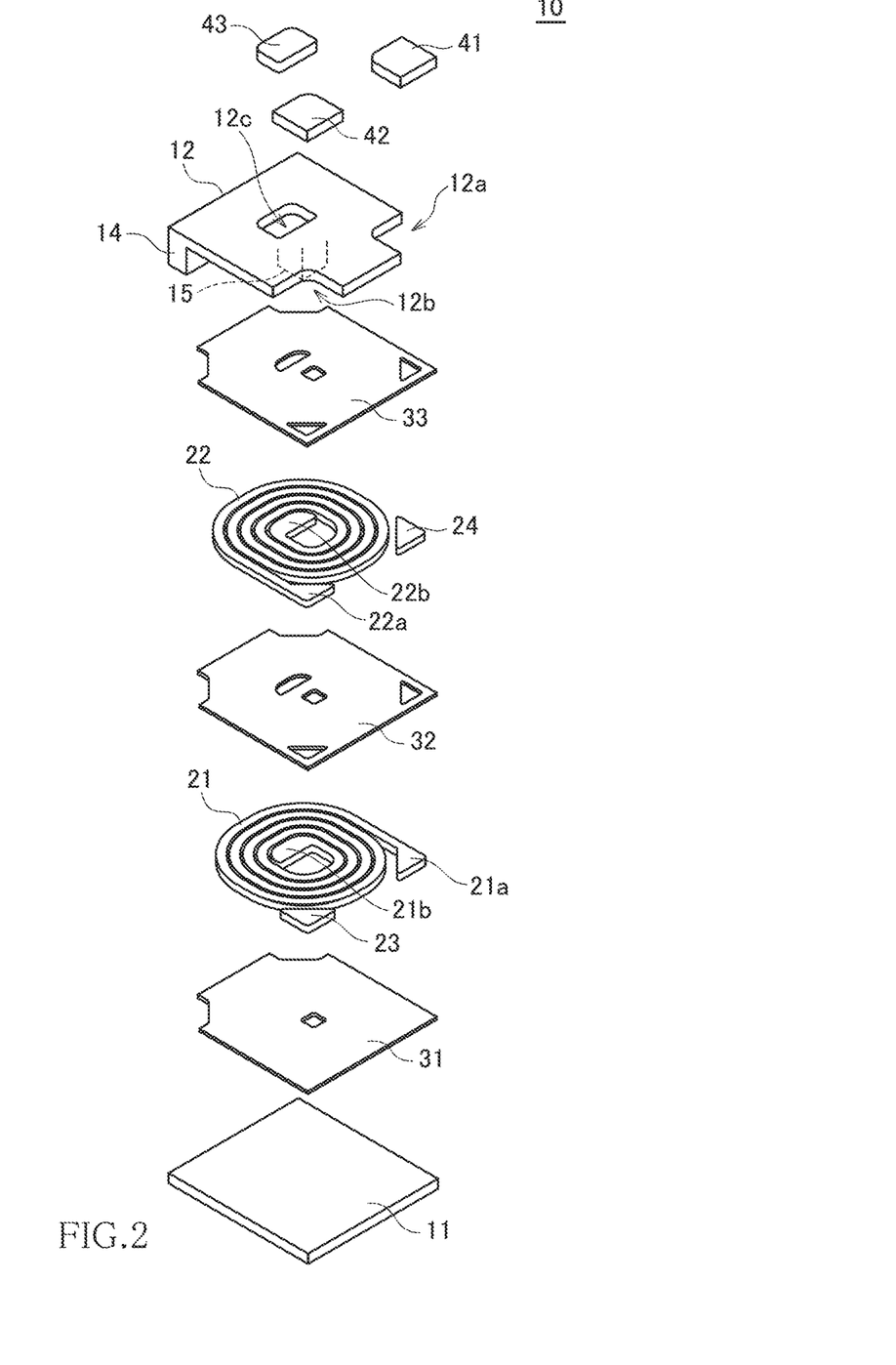
FIG. 2 is an exploded perspective view of the coil component shown in FIG. 1.
Figure 3:
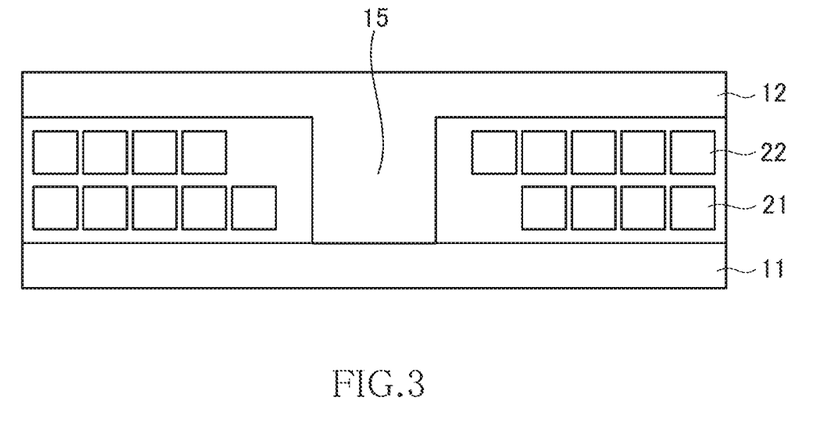
FIG. 3 is a cross-sectional view of the coil component taken along the line A-A illustrated in FIG. 1.
Figure 4:
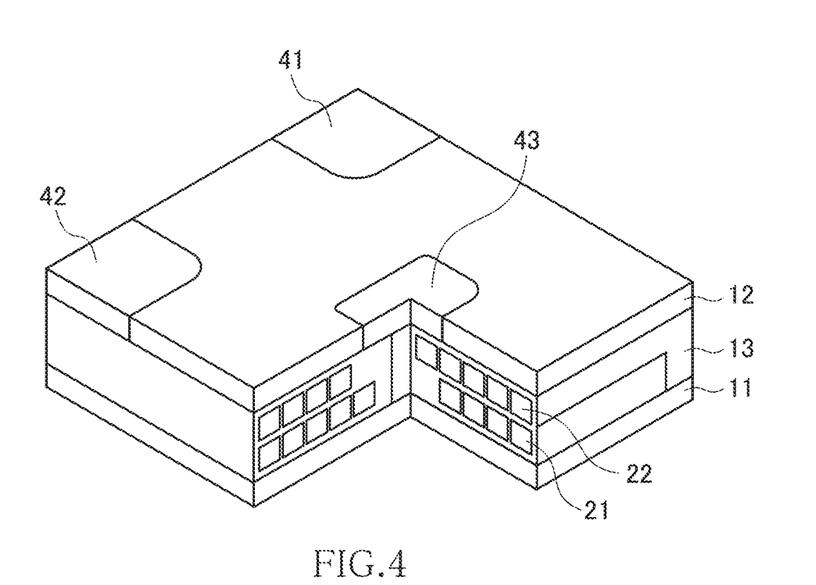
FIG. 4 is a cross-sectional view of the coil component taken along the line B-B illustrated in FIG. 1.

FIG. 1 is a perspective view illustrating the outer appearance of the coil component 10 according to a preferred embodiment of the present invention. FIG. 2 is an exploded perspective view of the coil component 10. FIG. 3 is a cross-sectional view of the coil component 10 taken along the line A-A illustrated in FIG. 1. FIG. 4 is a cross-sectional view of the coil component 10 taken along the line B-B illustrated in FIG. 1.

The coil component 10 according to the present embodiment is a chip component that can be used as a coupling inductor. As illustrated in FIGS. 1 to 4, the coil component 10 includes first and second magnetic members 11 and 12 and first and second planar spiral conductors 21 and 22. The first and second planar spiral conductors 21 and 22 are disposed so as to be sandwiched between the first and second magnetic members 11 and 12.

The magnetic member 11 is a substrate made of a magnetic material such as a sintered ferrite. As described later, in the manufacturing process of the coil component 10, the magnetic member 11 is used as a substrate, and the planar spiral conductor 21, 22 and magnetic member 12 are formed sequentially on the upper surface of the magnetic member 11. The magnetic member 12 is a composite member made of a resin containing ferrite powder or metal magnetic powder. As the metal magnetic powder, a permalloy-based material is preferably used. As the resin, a liquid or powder epoxy resin is preferably used.

The first planar spiral conductor 21 is formed on the upper surface of the magnetic member 11 through an insulating layer 31. The planar spiral conductor 21 is wound in the counterclockwise direction (left-hand direction) from an outer peripheral end 21a toward an inner peripheral end 21b when viewed in a lamination direction of the coil component. Although not especially limited, the number of turns of the planar spiral conductor 21 is, for example, four or five. A connection conductor 23 is also formed in the same conductor layer as that of the planar spiral conductor 21. The connection conductor 23 is provided independently of the planar spiral conductor 21. The outer peripheral end 21a and the inner peripheral end 21b each have a conductor width sufficiently larger than that of other portions of the planar spiral conductor 21.

The second planar spiral conductor 22 is formed on the upper surface of the first planar spiral conductor 21 through an insulating layer 32. The planar spiral conductor 22 is wound in the clockwise direction (right-hand direction) from an outer peripheral end 22a toward an inner peripheral end 22b when viewed in the lamination direction. That is, the planar spiral conductors 21 and 22 are wound in the opposite directions. The number of turns of the planar spiral conductor 22 is preferably equal to that of the planar spiral conductor 21. A connection conductor 24 is also formed in the same conductor layer as that of the planar spiral conductor 22. The connection conductor 24 is disposed so as to overlap the outer peripheral end 21a of the planar spiral conductor 21 and short-circuited thereto through a through hole formed in the insulating layer 32. Similarly, the above-described connection conductor 23 is disposed so as to overlap the outer peripheral end 22a of the planar spiral conductor 22. The connection conductor 23 and the outer peripheral end 22a of the planar spiral conductor 22 may be connected or may not be connected to each other. The outer peripheral end 22a and the inner peripheral end 22b each have a conductor width sufficiently larger than those of other portions of the planar spiral conductor 22.

The inner peripheral end 21b of the planar spiral conductor 21 and the inner peripheral end 22b of the planar spiral conductor 22 are disposed at the same plane position when viewed in the lamination direction and short-circuited through a through hole formed in the insulating layer 32. The planar positions of the inner peripheral ends 21b and 22b of the respective planar spiral conductors 21 and 22 need not completely coincide with each other, but it is only necessary that they overlap each other at least at the short-circuit position.

The planar spiral conductors 21, 22 and connection conductors 23, 24 are each a conductor exhibiting high electrical conductivity, such as a copper (Cu), and preferably formed by an electrolytic plating method.

The upper surface of the planar spiral conductor 22 is covered by the second magnetic member 12 through an insulating layer 33. The magnetic member 12 has two cut parts 12a and 12b and an opening part 12c, and first to third external terminals 41 to 43 are embedded in the cut parts 12a, 12b, and opening part 12c. The cut parts 12a and 12b each have a shape obtained by removing a part (corner portion) of the outer peripheral portion of the magnetic member 12, and thus the wall surfaces of the respective cut parts 12a and 12b constitute the outer peripheral wall of the magnetic member 12. The opening part 12c has a shape penetrating an inner portion of the magnetic member 12 away from the outer peripheral portion thereof. Thus, the inner peripheral wall of the opening part 12c does not constitute the outer peripheral wall of the magnetic member 12.

The cut part 12a is positioned just above the connection conductor 24 and exposes at least a part of the connection conductor 24 therethrough. As a result, the first external terminal 41 embedded in the cut part 12a is electrically connected to the outer peripheral end 21a of the first planar spiral conductor 21 through the connection conductor 24. The first external terminal 41 has an area larger than those of the outer peripheral end 21a of the first planar spiral conductor 21 and the connection conductor 24.

The cut part 12b is positioned just above the outer peripheral end 22a of the second planar spiral conductor 22 and exposes at least a part of the outer peripheral end 22a therethrough. As a result, the second external terminal 42 embedded in the cut part 12b is electrically connected to the outer peripheral end 22a of the second planar spiral conductor 22. The second external terminal 42 has an area larger than that of the outer peripheral end 22a of the second planar spiral conductor 22.

The opening part 12c is positioned just above the inner peripheral end 22b of the second planar spiral conductor 22 and exposes at least a part of the inner peripheral end 22b therethrough. As a result, the third external terminal 43 embedded in the opening part 12c is electrically connected to the inner peripheral ends 21b and 22b of the respective first and second planar spiral conductors 21 and 22. The third external terminal 43 has an area larger than those of the inner peripheral ends 21b and 22b of the respective first and second planar spiral conductors 21 and 22.

The external terminals 41 to 43 are each a conductor exhibiting high electrical conductivity, such as a copper (Cu), like the planar spiral conductors 21 and 22. In the present embodiment, the external terminals 41 to 43 and the planar spiral conductors 21 and 22 are made of the same metal material. That is, it can be said that the metal materials of the planar spiral conductors 21 and 22 are exposed as they are as the external terminals 41 to 43.

The upper surfaces of the external terminals 41 to 43 are exposed from the upper surface of the second magnetic member 12 and constitute substantially the same plane as the upper surface of the second magnetic member 12. A part of the outer peripheral side of each of the external terminals 41 and 42 constitutes a part of the outer peripheral side of the coil component 10 to be exposed outside. On the other hand, the outer periphery of the external terminal 43 is completely covered with the second magnetic member 12. Alternatively, a part of the outer peripheral surface of the external terminal 43 may constitute a part of the outer peripheral side of the coil component 10 at the surface of the second magnetic member 12 opposite to the side surface at which the external terminals 41 and 42 are formed to be exposed outside.

The external terminals 41 and 42 are provided at adjacent corner portions of the coil component 10 when viewed in the lamination direction. Magnetic members 13 and 14 each made of the same material as that of the second magnetic member 12 are embedded in the respective corner portions diagonally opposite to the corner portions at which the external terminals 41 and 42 are provided. Further, a third magnetic member 15 made of the same material as that of the second magnetic member 12 is embedded in the inner diameter portions of the planar spiral conductors 21 and 22. The third magnetic member 15 is provided so as to penetrate the inner diameter portion of the planar spiral conductors 21 and 22. The inner peripheral ends 21b and 22b provided in the inner diameter portions of the respective planar spiral conductors 21 and 22 are decentered to one side (to the upper-left side in FIG. 2) when viewed in the lamination direction, and the third magnetic member 15 is decentered to the other side (to the lower-right side in FIG. 2) when viewed in the lamination direction. As a result, the distance between the external terminals 41, 42 and the external terminal 43 is increased, whereby a short-circuit therebetween can be prevented.

The magnetic members 13 to 15 magnetically connect the first and second magnetic members 11 and 12 via through holes formed in the insulating layers 31 to 33 to thereby play a role of forming a closed magnetic path. The insulating layers 31 to 33 are each made of, e.g., a resin, and a non-magnetic material is preferably used for at least the insulating layer 32. The thickness of the insulating layer 32 is preferably equal to or smaller than ½ of the thickness of each of the planar spiral conductors 21 and 22. This allows adjustment of a degree of magnetic coupling while suppressing increase in DC resistance.

The configuration of the coil component 10 according to the present embodiment has thus been described. With the above configuration, the first and third external terminals 41 and 43 are connected to each other through the first planar spiral conductor 21. Similarly, the second and third external terminals 42 and 43 are connected to each other through the second planar spiral conductor 22. The first and second planar spiral conductors 21 and 22 are magnetically coupled in the lamination direction, so that when a current is made to flow in one of the first and second planar spiral conductors 21 and 22, the current also flows in the other one thereof by an electromotive force. Since the first and second planar spiral conductors 21 and 22 are wound in the opposite directions, the current flows in the same direction in the first and second planar spiral conductors 21 and 22.

Figure 5:
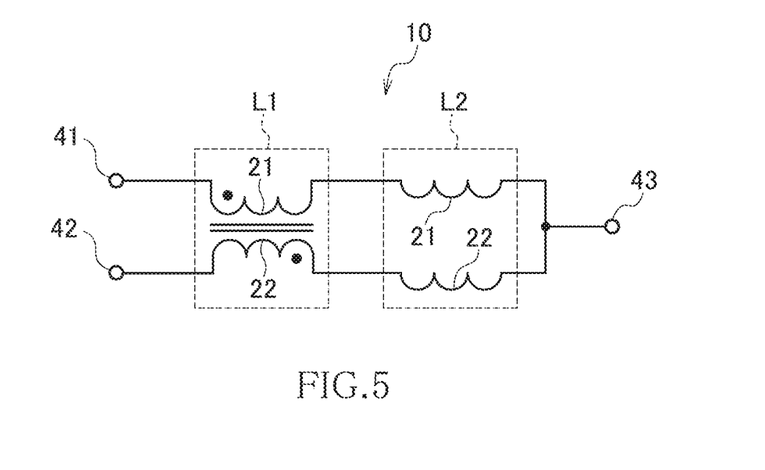
FIG. 5 is an equivalent circuit diagram of the coil component shown in FIG. 1.

FIG. 5 is an equivalent circuit diagram of the coil component 10 according to the present embodiment.

As illustrated in FIG. 5, the coil component 10 according to the present embodiment has an ideal transformer part L1 where magnetic coupling occurs and a leakage inductance component L2 where a leakage flux is generated. In the ideal transformer part L1, the planar spiral conductors 21 and 22 are magnetically-coupled in the opposite directions when the first and second external terminals 41 and 42 are set as an input side.

When the coil component 10 is used as a coupling inductor, a current is divided by the ideal transformer part L1 and then smoothed by the leakage inductance component L2. Thus, in order to obtain desired characteristics, it is necessary to ensure the leakage inductance component L2 by performing adjustment so as to reduce the magnetic coupling coefficient to some extent.

In the present embodiment, the magnetic coupling coefficient can be adjusted by the film thickness of the insulating layer 32. This is because the first and second planar spiral conductors 21 and 22 are magnetically coupled in the lamination direction. Therefore, in order to reduce the magnetic coupling coefficient, the film thickness of the insulating layer 32 needs to be increased. The film thickness of the insulating layer 32 does not have influence on the planar size of the coil component 10, so that the planar size of the coil component 10 is not increased due to adjustment of the magnetic coupling coefficient.

Further, the coil component 10 according to the present embodiment has three external terminals (41 to 43), so that eddy-current loss generated at the terminal part is small. In addition, unlike general coil components where an L-shaped terminal electrode is used, the coil component 10 according to the present embodiment has a configuration in which the external terminals 41 to 43 are directly exposed to the upper surface of the magnetic member 12, thus preventing increase in DC resistance.

Figure 6:
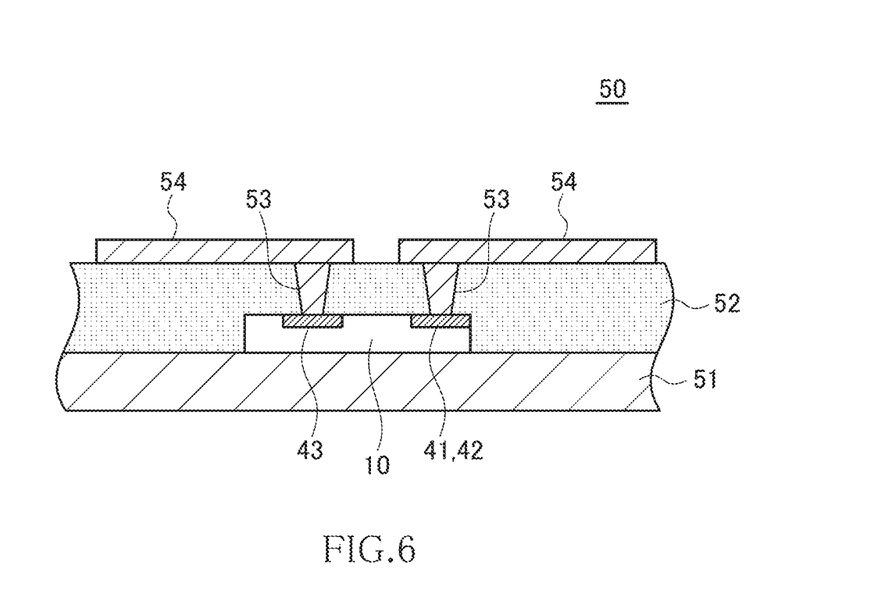
FIG. 6 is a cross-sectional view illustrating a configuration example of a circuit board in which the coil component is embedded.

FIG. 6 is a cross-sectional view illustrating a configuration example of a circuit board 50 in which the coil component 10 according to the present embodiment is embedded.

The circuit board 50 illustrated in FIG. 6 includes a resin substrate 51 and a resin layer 52, and the coil component 10 is embedded between the resin substrate 51 and the resin layer 52. Specifically, the coil component 10 is mounted on the upper surface of the resin substrate 51 in a face-up manner, whereby the external terminals 41 to 43 provided in the coil component 10 are exposed upward. The resin layer 52 is formed on the resin substrate 51 so as to embed the coil component 10 therein. The resin layer 52 has through holes 53 through which the respective external terminals 41 to 43 are exposed. A wiring pattern 54 formed on the upper surface of the resin layer 52 is connected to the external terminals 41 to 43 of the coil component 10 through the through holes 53.

When the coil component 10 is embedded in the circuit board 50 as described above, there is no need to perform soldering for connection between the external terminals 41 to 43 and the wiring pattern 54, thus eliminating the need for applying tin plating to the surfaces of the external terminals 41 to 43 and allowing copper (Cu) constituting the external terminals 41 to 43 to be exposed as it is.

By mounting a switching power supply on the circuit board 50, a switching power supply including a coupling inductance can be realized using a single circuit board. A high current flows in a coupling inductor for the switching power supply, and thus a comparatively large amount of heat is generated. The heat thus generated is radiated mainly from an external terminal made of metal. In the coil component 10 according to the present embodiment, the external terminal 43 is disposed at substantially the center portion of the coil component 10 in a plan view, allowing heat accumulated around the center portion of the coil component 10 to be radiated efficiently.

The coil component 10 can be mounted on the surface of the circuit board with the external terminals 41 to 43 facing upward. In this case, wire bonding is applied directly to the external terminals 41 to 43. Further, for the coil component 10 having the above-described configuration in which a part of the outer peripheral surface of the external terminal 43 constitutes a part of the outer peripheral side of the coil component 10 at the surface of the second magnetic member 12 opposite to the side surface at which the external terminals 41 and 42 are formed to be exposed outside, normal solder mounting where the external terminals 41 to 43 are bonded to the circuit board is possible.

The following describes a manufacturing method for the coil component 10 according to the present embodiment.

FIGS. 7A to 7G are planar pattern views for explaining a manufacturing process of the coil component 10 according to the present embodiment.

Figure 7A:
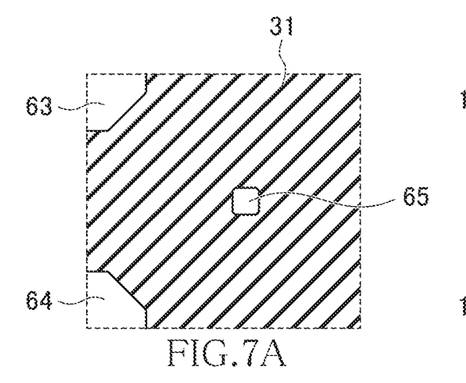
FIGS. 7A to 7G are planar pattern views for explaining a manufacturing process of the coil component.

The magnetic member 11 made of a sintered ferrite having a predetermined thickness is prepared, and the insulating layer 31 is formed on the upper surface of the magnetic member 11 in a pattern illustrated in FIG. 7A. Specifically, a resin material is applied on the upper surface of the magnetic member 11 using a spin coating method, and then a predetermined pattern is formed by a photolithography method. Through holes 63 to 65 illustrated in FIG. 7A are portions that receive the magnetic members 13 to 15 in the following process.

Figure 7B:
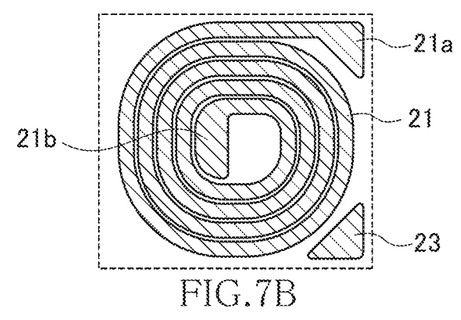

Subsequently, as illustrated in FIG. 7B, the first planar spiral conductor 21 and the connection conductor 23 are formed on the upper surface of the insulating layer 31. A formation method for these conductors preferably includes forming a base metal film using a thin-film forming process such as sputtering and then plating-growing the base metal film to a desired film thickness using an electrolytic plating method.

Figure 7C:
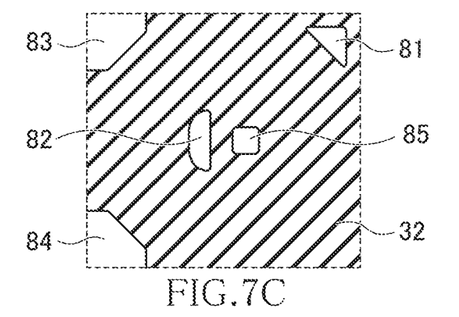

Subsequently, as illustrated in FIG. 7C, the insulating layer 32 is formed on the upper surface of the insulating layer 31 so as to cover the first planar spiral conductor 21 and connection conductor 23. A formation method for the insulating layer 32 is the same as that for the insulating layer 31. That is, a resin material is applied using the spin coating method, and then a predetermined pattern is formed by the photolithography method. Through holes 81 and 82 illustrated in FIG. 7C are formed respectively at positions at which the outer peripheral end 21a and inner peripheral end 21b of the spiral conductor 21 are exposed. Through holes 83 to 85 are portions that receive the magnetic members 13 to 15 in the following process.

Figure 7D:
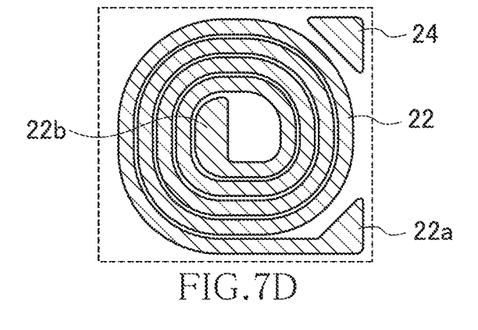

Subsequently, as illustrated in FIG. 7D, the second planar spiral conductor 22 and connection conductor 24 are formed on the upper surface of the insulating layer 32. As a result, the inner peripheral end 22b of the planar spiral conductor 22 is connected to the inner peripheral end 21b of the planar spiral conductor 21 through the through hole 82. Further, the connection conductor 24 is connected to the outer peripheral end 21a of the planar spiral conductor 21 through the through hole 81. A formation method for these conductors is as described above.

Figure 7E:
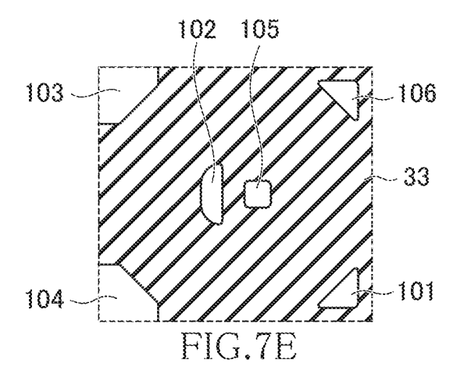
Figure 7F:
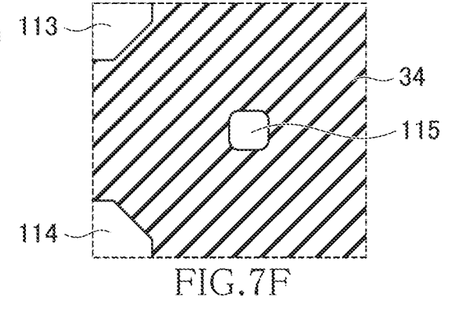

Subsequently, as illustrated in FIGS. 7E and 7F, the insulating layer 33 and an ion-milling mask 34 are formed in this order on the upper surface of the insulating layer 32 so as to cover the second planar spiral conductor 22 and the connection conductor 24. A formation method for the insulating layer 33 and the mask 34 is the same as that for the insulating layers 31 and 32. Through holes 101 and 102 illustrated in FIG. 7E are formed respectively at positions at which the outer peripheral end 22a and inner peripheral end 22b of the planar spiral conductor 22 are exposed. A through hole 106 is formed at a position at which the connection conductor 24 is exposed. Through holes 103 to 105 are portions that receive the magnetic members 13 to 15 in the following process. Similarly, through holes 113 to 115 illustrated in FIG. 7F are portions that receive the magnetic members 13 to 15 in the following process.

Figure 7G:
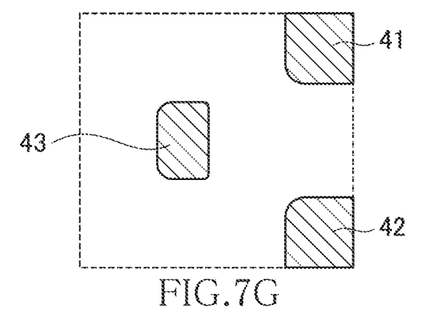

In this state, the ion-milling mask 34 is used to apply ion-milling to the through holes 113 to 115. Then, portions of each of the insulating layers 31 to 33 that correspond to the through holes 113 to 115 are removed, with the result that the magnetic member 11 is exposed at the removed portions. Then, after removal of the ion-milling mask 34, the external terminals 41 to 43 are formed on the upper surface of the insulating layer 33 as illustrated in FIG. 7G. As a result, the external terminal 41 is connected to the connection conductor 24 through the through hole 106, the external terminal 42 is connected to the outer peripheral end 22a of the planar spiral conductor 22 through the through hole 101, and the external terminal 43 is connected to the inner peripheral end 22b of the planar spiral conductor 22 through the through hole 102. A formation method for these conductors is as described above.

Subsequently, a resin containing a magnetic body is formed on the entire surface. As a result, the magnetic-material-containing resin is embedded in concave portions which are obtained by removing the portions of each of the insulating layers 31 to 33 that correspond to the through holes 113 to 115, whereby the magnetic members 13 to 15 are formed and, at the same time, the magnetic member 12 that covers the upper surface of the insulating layer 33 is formed. Thereafter, the magnetic member 12 is ground until the upper surfaces of the external terminals 41 to 43 are exposed, and the magnetic member 11 which is a base plate is ground to a desired thickness. Thus, the coil component 10 according to the present embodiment is completed.

As described above, in the coil component 10 according to the present embodiment, the thin-film forming process and electrolytic plating method are used to form the planar spiral conductors 21 and 22, so that pattern formation accuracy can be increased as compared to a case where a winding is made up of wire or foil.

It is apparent that the present invention is not limited to the above embodiments, but may be modified and changed without departing from the scope and spirit of the invention.

What is claimed is:

1. A coil component comprising:
a first planar spiral conductor;
a second planar spiral conductor laminated on the first planar spiral conductor and wound in an opposite direction to the first planar spiral conductor;
a first external terminal electrically connected to an outer peripheral end of the first planar spiral conductor;
a second external terminal electrically connected to an outer peripheral end of the second planar spiral conductor;
a third external terminal electrically connected in common to inner peripheral ends of the first and second planar spiral conductors;
a non-magnetic insulating layer disposed between the first and second planar spiral conductors; and
first and second magnetic members that sandwich the first planar spiral conductor, non-magnetic insulating layer, and the second planar spiral conductor in a lamination direction,
wherein the second magnetic member has an opening part through which the inner peripheral end of the second planar spiral conductor is exposed, and
wherein the third external terminal is embedded in the opening part.

2. The coil component as claimed in claim 1, wherein the inner peripheral ends of the first and second planar spiral conductors overlap each other in a lamination direction and are short-circuited in the lamination direction at an overlapping position.

3. The coil component as claimed in claim 2, wherein at least a part of the third external terminal overlaps the inner peripheral ends of the first and second planar spiral conductors in the lamination direction.

4. The coil component as claimed in claim 1, further comprising a connection conductor provided on a same plane as the second planar spiral conductor and electrically connected to the outer peripheral end of the first planar spiral conductor,
wherein the second magnetic member includes a first cut part through which the connection conductor is exposed and a second cut part through which the outer peripheral end of the second planar spiral conductor is exposed, and
wherein the first and second external terminals are embedded in the first and second cut parts, respectively.

5. The coil component as claimed in claim 1 wherein the first and second magnetic members are made of different magnetic materials.

6. The coil component as claimed in claim 1, further comprising a third magnetic member provided in a vicinity of the inner peripheral ends of the first and second planar spiral conductors when viewed in a lamination direction so as to penetrate the inner diameter portions of the first and second planar spiral conductors,
wherein the first and second external terminals are positioned at one side of the third magnetic member in the lamination direction, and
wherein the third external terminal is positioned at other side of the third magnetic member in the lamination direction.

7. The coil component as claimed in claim 1, wherein the first to third external terminals are made of a same material as that of a metal material of the first and second planar spiral conductors.

8. A circuit board in which a coil component is embedded, wherein the coil component comprises:
a first planar spiral conductor;
a second planar spiral conductor laminated on the first planar spiral conductor and wound in an opposite direction to the first planar spiral conductor;
a first external terminal electrically connected to an outer peripheral end of the first planar spiral conductor;
a second external terminal electrically connected to an outer peripheral end of the second planar spiral conductor; and
a third external terminal electrically connected in common to inner peripheral ends of the first and second planar spiral conductors,
wherein the circuit board comprises:
a resin substrate on which the coil component is mounted in a face-up manner; and
a resin layer formed on the resin substrate so as to embed the coil component, and
wherein the resin layer has through holes through which the first to third external terminals are exposed.

9. The circuit board as claimed in claim 8, wherein the circuit board further comprises a wiring pattern formed on the resin layer, the wiring pattern being electrically connected to the first to third external terminals through the through holes.

10. A coil component comprising:
a first planar spiral conductor;

a second planar spiral conductor laminated on the first planar spiral conductor and wound in an opposite direction to the first planar spiral conductor;

a first external terminal electrically connected to an outer peripheral end of the first planar spiral conductor;

a second external terminal electrically connected to an outer peripheral end of the second planar spiral conductor;

a third external terminal electrically connected in common to inner peripheral ends of the first and second planar spiral conductors; and a magnetic member provided in a vicinity of the inner peripheral ends of the first and second planar spiral conductors when viewed in a lamination direction so as to penetrate the inner diameter portions of the first and second planar spiral conductors, wherein the first and second external terminals are positioned at one side of the magnetic member in the lamination direction, and wherein the third external terminal is positioned at other side of the magnetic member in the lamination direction.

11. The coil component as claimed in claim 10, further comprising a non-magnetic insulating layer disposed between the first and second planar spiral conductors.

12. The coil component as claimed in claim 10, wherein the inner peripheral ends of the first and second planar spiral conductors overlap each other in a lamination direction and are short-circuited in the lamination direction at an overlapping position.

13. The coil component as claimed in claim 12, wherein at least a part of the third external terminal overlaps the inner peripheral ends of the first and second planar spiral conductors in the lamination direction.

14. The coil component as claimed in claim 10, wherein the first to third external terminals are made of a same material as that of a metal material of the first and second planar spiral conductors.

* * * * *